United States Patent
Kitayama et al.

(10) Patent No.: US 7,235,137 B2
(45) Date of Patent: Jun. 26, 2007

(54) CONDUCTOR TREATING SINGLE-WAFER TYPE TREATING DEVICE AND METHOD FOR SEMI-CONDUCTOR TREATING

(75) Inventors: Hirofumi Kitayama, Nirasaki (JP); Noriaki Matsushima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 212 days.

(21) Appl. No.: 10/466,116

(22) PCT Filed: Dec. 10, 2001

(86) PCT No.: PCT/JP01/10796

§ 371 (c)(1),
(2), (4) Date: Jul. 23, 2003

(87) PCT Pub. No.: WO02/059953

PCT Pub. Date: Aug. 1, 2002

(65) Prior Publication Data

US 2004/0097088 A1 May 20, 2004

(30) Foreign Application Priority Data

Jan. 23, 2001 (JP) .............................. 2001-014348

(51) Int. Cl.
*H01L 21/302* (2006.01)
*C23C 16/00* (2006.01)

(52) U.S. Cl. ................. 118/724; 361/234; 156/345.53; 118/712

(58) Field of Classification Search ................ 118/724, 118/712; 361/234; 156/345.53
See application file for complete search history.

(56) References Cited

U.S. PATENT DOCUMENTS

| | | | | |
|---|---|---|---|---|
| 5,078,851 A | * | 1/1992 | Nishihata et al. | 204/298.34 |
| 5,177,878 A | * | 1/1993 | Visser | 34/92 |
| 5,846,375 A | * | 12/1998 | Gilchrist et al. | 156/345.52 |
| 5,892,207 A | * | 4/1999 | Kawamura et al. | 219/492 |
| 6,063,710 A | | 5/2000 | Kadomura et al. | |
| 6,723,202 B2 | * | 4/2004 | Nagaiwa et al. | 118/715 |
| 6,776,874 B2 | * | 8/2004 | Kobayashi et al. | 156/345.51 |
| 2003/0015294 A1 | * | 1/2003 | Wang | 156/345.52 |

FOREIGN PATENT DOCUMENTS

| | | |
|---|---|---|
| EP | 1001454 | 5/2000 |
| JP | 02-256235 | 10/1990 |
| JP | 07-130830 | 5/1995 |
| JP | 09-036097 | 2/1997 |

* cited by examiner

*Primary Examiner*—Sylvia R. MacArthur
(74) *Attorney, Agent, or Firm*—Oblon, Spivak, McClelland, Maier & Neustadt, P.C.

(57) ABSTRACT

A single-substrate processing apparatus (20) has a worktable (40) disposed in a process chamber (24), which accommodates a target substrate (W). The worktable (40) has a thermally conductive mount surface (41) to place the target substrate (W) thereon. The worktable (40) is provided with a flow passage (50) formed therein, in which a thermal medium flows for adjusting temperature of the target substrate (W) through the mount surface (41). The flow passage (50) is connected to a thermal medium supply system (54), which selectively supplies a cooling medium and a heating medium.

22 Claims, 7 Drawing Sheets

CONDUCTOR TREATING SINGLE-WAFER TYPE TREATING DEVICE AND METHOD FOR SEMI-CONDUCTOR TREATING

TECHNICAL FIELD

The present invention relates to a single-substrate processing apparatus and method for a semiconductor process, which performs a process such as oxide film removal, annealing, film formation, etching, oxidation, or diffusion. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

BACKGROUND ART

In the process of manufacturing semiconductor devices, a semiconductor wafer is subjected to processes of various kinds, such as film-formation, oxidation, diffusion, annealing, reformation, and etching. Before the processes, there may be a natural oxide film (consisting of $SiO_2$ if the wafer is Si) formed on the surface of the semiconductor wafer. The natural oxide film can cause the semiconductor devices to have lower electrical characteristics or to be defective. For this reason, a treatment of removing the natural oxide film from the surface of the semiconductor wafer, i.e., pre-cleaning, is performed before the processes.

Jpn. Pat. Appln. KOKAI Publication No. 2-256235 discloses an example of a method of the pre-cleaning. In this method, a natural oxide film on a semiconductor wafer is first converted into an intermediate that easily sublimes. Then, the wafer is heated to sublimate and remove the intermediate. The formation of the intermediate is performed in a first processing apparatus at a low process temperature, and the sublimation of the intermediate is performed in a second processing apparatus at a high process temperature.

DISCLOSURE OF INVENTION

An object of the present invention is to provide a single-substrate processing apparatus and method for performing semiconductor processes having different process temperatures on a target substrate.

According to a first aspect of the present invention, there is provided a single-substrate processing apparatus for a semiconductor process, comprising:

a process chamber configured to accommodate a target substrate;

an exhaust system configured to vacuum-exhaust the process chamber;

a gas supply system configured to supply a process gas into the process chamber;

a worktable disposed in the process chamber and having a thermally conductive mount surface configured to place the target substrate thereon;

a flow passage formed in the worktable, in which a thermal medium flows for adjusting temperature of the target substrate through the mount surface; and a thermal medium supply system configured to selectively supply a cooling medium and a heating medium into the flow passage.

According to a second aspect of the present invention, there is provided a single-substrate processing method in the apparatus according to first aspect, comprising:

performing a first process while supplying the cooling medium into the flow passage to set the target substrate at a first process temperature; and performing a second process while supplying the heating medium into the flow passage to set the target substrate at a second process temperature higher than the first process temperature.

According to a third aspect of the present invention, there is provided a single-substrate processing apparatus for performing a first process of converting a semiconductor oxide film on a target substrate into an intermediate film, and a second process of evaporating the intermediate film by thermal decomposition, to remove the semiconductor oxide film, the apparatus comprising:

a process chamber configured to accommodate a target substrate;

an exhaust system configured to vacuum-exhaust the process chamber;

a gas supply system configured to supply the process chamber selectively with a first process gas, which reacts with the semiconductor oxide film to convert the semiconductor oxide film into the intermediate film in the first process, and a second process gas, which assists removal of evaporated matters of the intermediate film in the second process;

a worktable disposed in the process chamber and having a thermally conductive mount surface configured to place the target substrate thereon;

a flow passage formed in the worktable, in which a thermal medium flows for adjusting temperature of the target substrate through the mount surface; and a thermal medium supply system configured to selectively supply a cooling medium and a heating medium into the flow passage, wherein the cooling medium is supplied into the flow passage in the first process, and the heating medium is supplied into the flow passage in the second process.

BEST MODE FOR CARRYING OUT THE INVENTION

Figure 10:
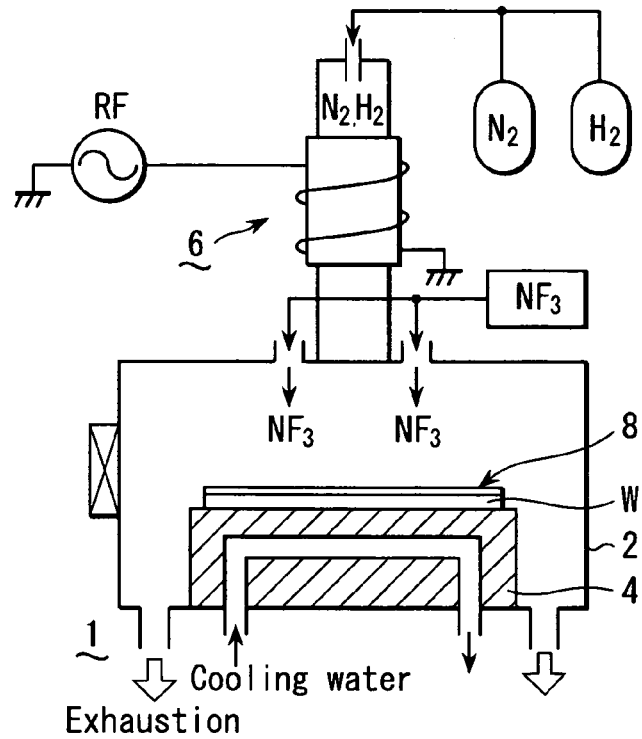
FIG. 10 is a constitutional view showing an apparatus model for forming an intermediate.
Figure 11:
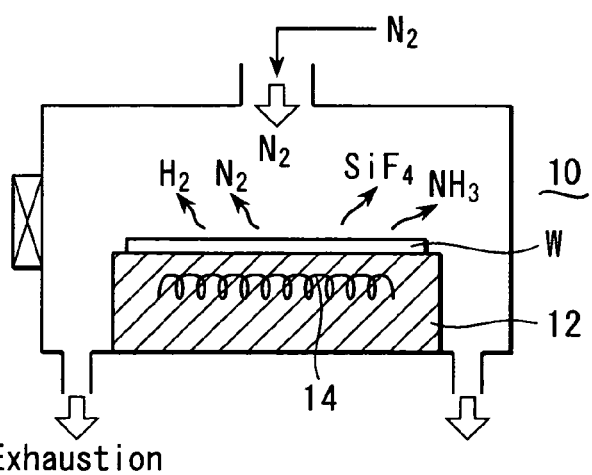
FIG. 11 is a constitutional view showing an apparatus model for sublimating the intermediate.

In the process of developing the present invention, the inventors studied the case of performing the pre-cleaning method disclosed in Jpn. Pat. Appln. KOKAI Publication No. 2-256235, while assuming an apparatus model for converting an oxide film into an intermediate, and an apparatus model for sublimating the intermediate. FIGS. 10 and 11 are constitutional views respectively showing an apparatus model for forming an intermediate and an apparatus model for sublimating the intermediate.

As shown in FIG. 10, the processing apparatus 1 has a process chamber 2, which can be vacuum-exhausted, and a worktable 4, on which a semiconductor wafer W formed of a silicon wafer is placed. An unnecessary natural oxide film has already been formed on the surface of the wafer W. On the ceiling of the process chamber 2, a remote plasma generating mechanism 6 is disposed, for forming plasma from $N_2$ gas and $H_2$ gas by a radio frequency (RF) power of 13.56 MHz. The plasma is utilized to generate hydrogen radicals (H*) and nitrogen radicals (N*).

The worktable 4 is supplied with cooling water flowing therein to keep the wafer at a relatively low temperature of about 15° C. The process chamber 2 is kept in a pressure-reduced state and is fed with $NF_3$ gas as well as the hydrogen radicals (H*) and nitrogen radicals (N*). The $NF_3$ gas and H* and N* radicals react with the natural oxide film to convert the natural oxide film into an intermediate consisting of $(NH_4)_2SiF_6$, thereby forming an intermediate film 8.

Then, the semiconductor wafer W with the intermediate film 8 formed on the surface is taken out of the processing apparatus 1, and is transferred into the other processing apparatus 10 shown in FIG. 11. The processing apparatus 10 has a worktable 12 with a resistance heater 14 used as heating means. The semiconductor wafer W is kept at a relatively high temperature of about 200° C. under a pressure-reduced atmosphere of $N_2$ gas. The intermediate film 8 sticking to the surface of the wafer W is thermally decomposed and evaporated to turn into $H_2$, $N_2$, $NH_3$, $SiF_4$, $H_2O$ gas, and so forth, which are then exhausted. As a consequence, the natural oxide film is removed from the surface of the wafer W.

The processing apparatuses 1 and 10 satisfy their respective functions, i.e., the function of forming an intermediate, and the function of sublimating the intermediate. However, the two necessary apparatuses 1 and 10 inevitably bring about a high installation cost. Particularly, in the case of an installation of the cluster tool type that has a plurality of processing apparatuses of various kinds disposed around a transfer chamber, the number of processing apparatuses that the transfer chamber can be connected to is limited. Accordingly, it is not preferable also in process efficiency to use two processing apparatuses only for removing the oxide film.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
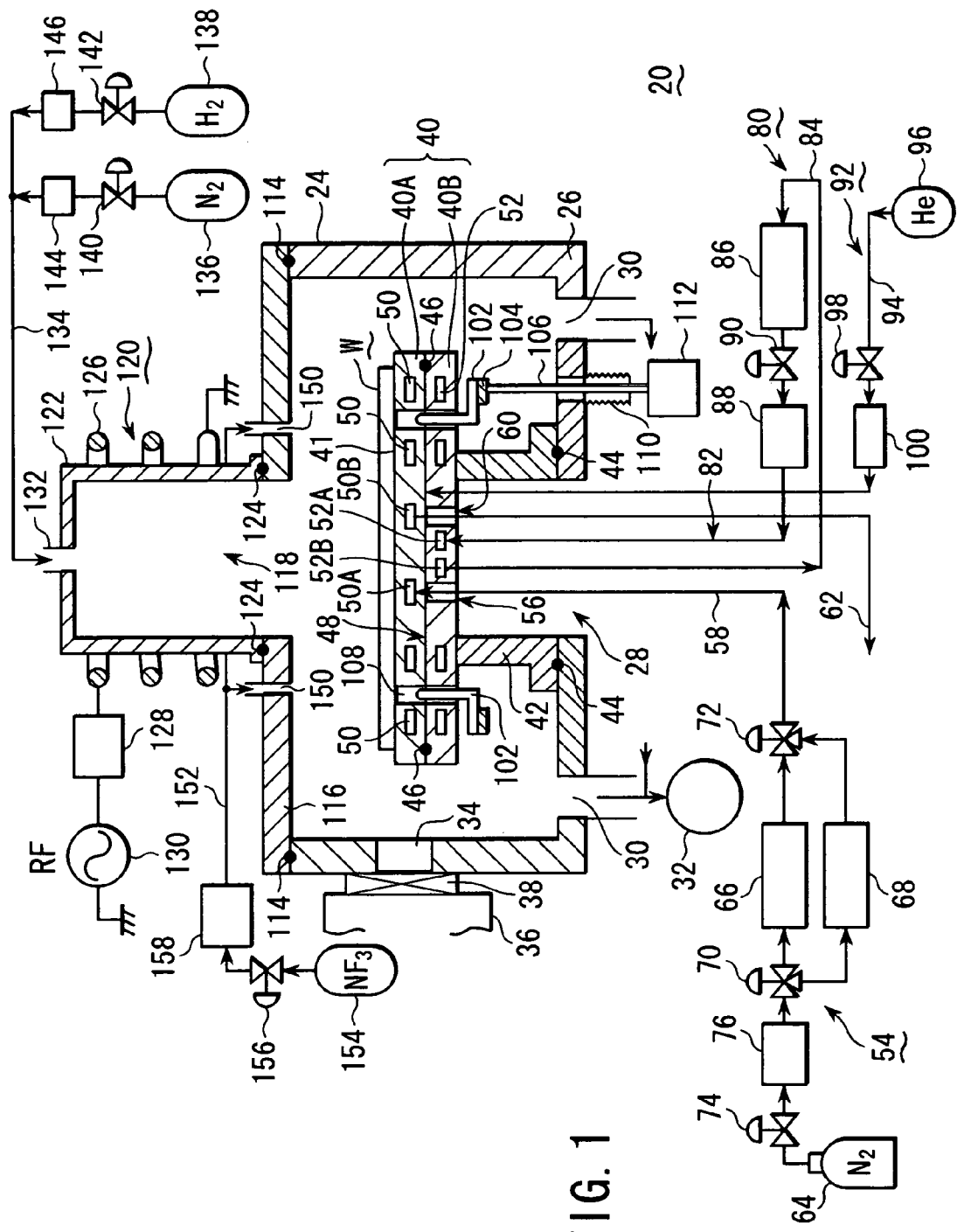
FIG. 1 is a constitutional view showing a single-substrate processing apparatus for a semiconductor process according to an embodiment of the present invention.

FIG. 1 is a constitutional view showing a single-substrate processing apparatus for a semiconductor process according to an embodiment of the present invention. This apparatus is used for removing an oxide film formed on a semiconductor wafer, such as a silicon wafer.

As shown in FIG. 1, the processing apparatus 20 has a process chamber 24 with a cylindrical inside formed of, e.g., aluminum. The process chamber 24 has an opening 28 formed at the center of the bottom 26, and exhaust ports 30 formed in the periphery. The exhaust ports 30 are connected to a vacuum-exhaust section 32, which includes a vacuum pump and so forth, and can vacuum-exhaust the process chamber 24. A plurality of, e.g., four, exhaust ports 30 are formed equidistantly in a circle, and are connected to the vacuum-exhaust section 32 in common.

The sidewall of the process chamber 24 is provided with a wafer transfer port 34 connected to a transfer chamber 36, which can be vacuum-exhausted. A gate valve 38 is interposed between the process chamber 24 and transfer chamber 36 to open/close the port 34. In place of the transfer chamber 36, a load-lock chamber may be disposed.

In the process chamber 24, there is a worktable 40 formed of a circular plate, which is made of, e.g., aluminum surfaced with alumite. The worktable 40 has a thermally conductive mount surface 41 as a top surface, on which a semiconductor wafer W, such as a silicon wafer, is placed. A hollow cylindrical column 42 is integrated with the bottom of the worktable 40 at the center and extends downward. The lower end of the column 42 is fixed by, e.g., bolts, to the portion around the opening 28 of the chamber bottom 26, airtightly by a sealing member 44, such as an O-ring. The interior space of the column 42 communicates with the atmosphere outside the process chamber 24, while it is airtightly isolated from the interior space of the process chamber 24.

The worktable 40 is formed of upper and lower blocks, i.e., an upper block 40A shaped like a thin circular plate and a lower block 40B shaped like a thin circular plate, which are separately formed and joined together. Each of the blocks 40A and 40B has a thickness of about 2 cm. A sealing member 46, such as an O-ring, is interposed in the joint between the blocks 40A and 40B along the periphery. The sealing member 46 airtightly isolates a very small clearance 48 between the blocks 40A and 40B from the atmosphere in the process chamber 24.

Figure 2:
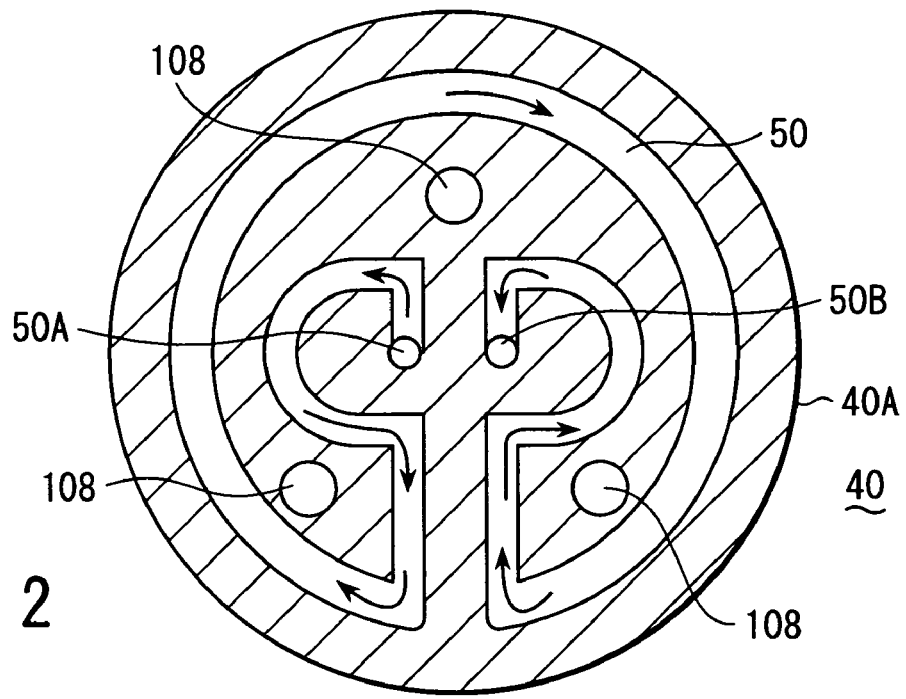
FIG. 2 is a sectional plan view showing a flow passage formed in the upper block of a worktable used in the apparatus shown in FIG. 1.
Figure 3:
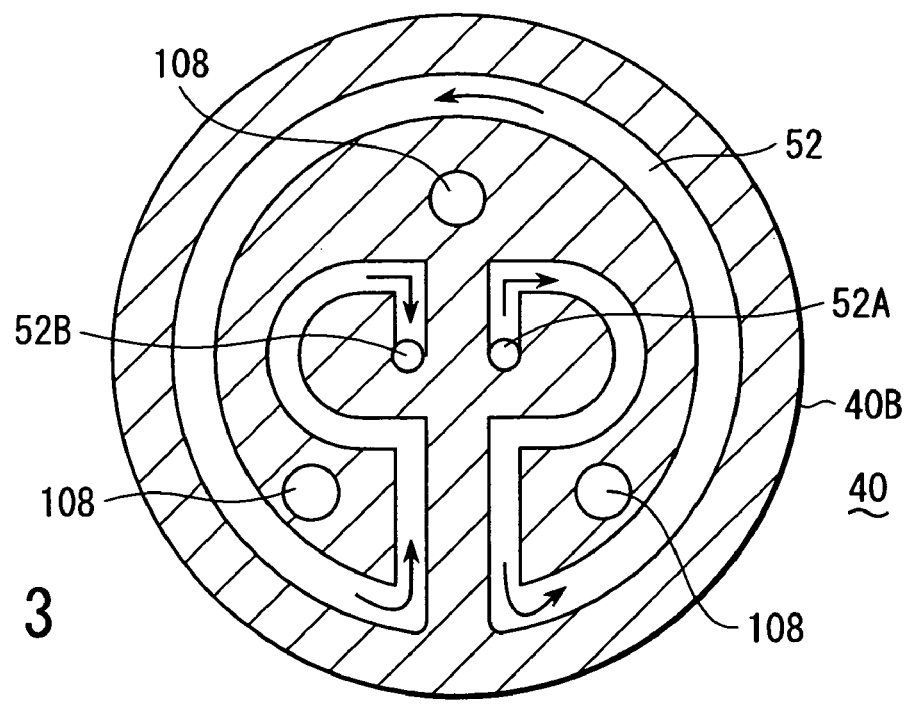
FIG. 3 is a sectional plan view showing an auxiliary flow passage formed in the lower block of the worktable used in the apparatus shown in FIG. 1.

FIG. 2 is a sectional plan view showing a flow passage formed in the upper block 40A of the worktable 40. FIG. 3 is a sectional plan view showing an auxiliary flow passage formed in the lower block 40B of the worktable 40. The flow passage 50 in the upper block 40A has a cross section of, e.g., a rectangle, and is formed as if it circulates with, e.g., one or two turns, all over the upper block 40A. The auxiliary flow passage 52 in the lower block 40B has a cross section of, e.g., a rectangle, and is formed as if it circulates with, e.g., one or two turns, all over the lower block 40B. The number of turns of each of the flow passages 50 and 52 is not limited to the number describe, and it may be more.

The flow passage 50 in the upper block 40A is connected to a thermal medium supply section 54. The thermal medium supply section 54 selectively supplies the flow passage 50 with a cooling medium for performing a low temperature process and a heating medium for performing a high temperature process. The cooling medium and heating medium are formed of a common inactive gas, such as nitrogen gas, and the temperature of the nitrogen gas is changed to do either cooling or heating.

More specifically, the inlet 50A of the flow passage 50 is connected to a supply line 58 via a through hole 56 formed in the lower block 40B. The outlet SOB of the flow passage 50 is connected to an exhaust line 62 via a through hole 60 formed in the lower block 40B. The supply line 58 is connected to a nitrogen gas source 64 thorough separate two lines, which are provided with a cooler 66 and a heater 68, respectively. The cooler 66 cools the nitrogen gas to −5 to 40° C., and preferably to 5 to 20° C., and supplies it. The heater 68 heats the nitrogen gas to 100 to 400° C., and preferably to 150 to 250° C., and supplies it.

The supply line 58 is provided with switching valves 70 and 72, such as three-way valves, at the branching portions, so that the cooled or heated thermal medium is selectively supplied into the flow passage 50. The supply line 58 is also provided with a switching valve 74 and a flow controller 76, such as a mass flow controller, in this order between the gas source 64 and switching valve 70. The nitrogen gas may be used such that it is circulated.

The auxiliary flow passage 52 in the lower block 40B is connected to a cooling liquid supply section 80. The cooling liquid is supplied into the auxiliary flow passage 52, when it is necessary to accelerate temperature descent of the worktable 40. A liquid having a large thermal capacity, such as cooling water is used as the cooling liquid. More specifically, the inlet 52A of the auxiliary flow passage 52 is connected to a supply line 82. The outlet 52B of the auxiliary flow passage 52 is connected to an exhaust line 82. The two lines 82 and 84 are connected to a cooling liquid source 86, which stores the cooling liquid and supplies it by pressure, so that the cooling water is used while being circulated. The supply line 82 is provided with a cooler 88 for cooling the cooling liquid to −5 to 40° C., and preferably to 0 to 20° C., and a switching valve 90 in this order.

The small clearance 48 in the joint between the upper block 40A and lower block 42B is connected to a thermally conductive gas supply section 92 for supplying therein a thermally conductive gas, such as an inactive gas, e.g., helium gas. More specifically, the clearance 48 is connected to the helium source 96 through a gas line 94. The gas line 94 is provided with a switching valve 98 and a flow controller 100, such as a mass-flow controller, in this order. In place of the helium gas, argon gas may be used.

A plurality of, e.g., three, L-shaped lifter pins 102 (only two of them are shown in FIG. 1) are disposed to stand upward below the worktable 40. The bottoms of the lifter pins 102 are connected to a ring 104 in common. The ring 104 is moved up and down by a push-up rod 106, which penetrates the chamber bottom 26. The lifter pins 102 extend through lifter holes 108 formed through the worktable 40, and can lift the wafer W to assist load and unload of the wafer W relative to the worktable 40. The portion where the push-up rod 106 penetrates the chamber bottom 26 is provided with bellows 110, which is extensible/contractible. The bottom end of the push-up rod 106 is connected to an actuator 112. The bellows 110 allows the push-up rod 106 to move up and down while maintaining the inside of the process chamber 24 airtight.

A ceiling plate 116 forms the ceiling of the process chamber 24 airtightly with a sealing member 114. The ceiling plate 116 has a radicals port 118 formed at the center and having a relatively large diameter. The radicals port 118 is connected to an exciting mechanism 120 for turning part of a process gas into plasma. The exciting mechanism 120 has a cylindrical remote plasma chamber 122, which is located such that plasma generated therein can essentially not reach the wafer W on the worktable 40. The plasma chamber 122 is made of an insulating material, such as quartz or ceramic.

The plasma chamber 122 is provided with a coil antenna 126 wound therearound, which generates an electric field for exciting and turning gas into plasma in the plasma chamber 122. The coil antenna 126 is connected through a matching circuit 128 to a radio frequency (RF) power supply 130 for supplying an RF power of, e.g., 13.56 MHz. The power supply 130 applies an RF power to the coil antenna 126 to induce an electric field for exciting and turning gas into plasma in the plasma chamber 122.

The ceiling of the plasma chamber 122 is provided with a gas inlet port 132 formed therein and connected to a gas line 134. The gas line 134 is connected to an $N_2$ gas source 136 and an $H_2$ gas source 138 disposed in parallel. The branching lines to the $N_2$ gas source 136 and $H_2$ gas source 138 are respectively provided with switching valves 140 and 142 and flow controllers 144 and 146, such as mass-flow controllers, in this order.

The ceiling plate 116 of the process chamber 24 is provided with a plurality of gas inlet ports 150, which are formed around the radicals port 118 and connected to a gas line 152. The gas line 152 is connected to an $NF_3$ gas-source 154 through a switching valve 156 and a flow controller 158, such as a mass-flow controller.

Between the upper and lower blocks 40A and 40B of the worktable 40, sealing members, such as O-rings, are interposed around each of the lifter holes 108 and through holes 56 and 60. The sealing members maintain the inside of the process chamber 24 and the inside of the clearance 48 airtight.

Figure 4:
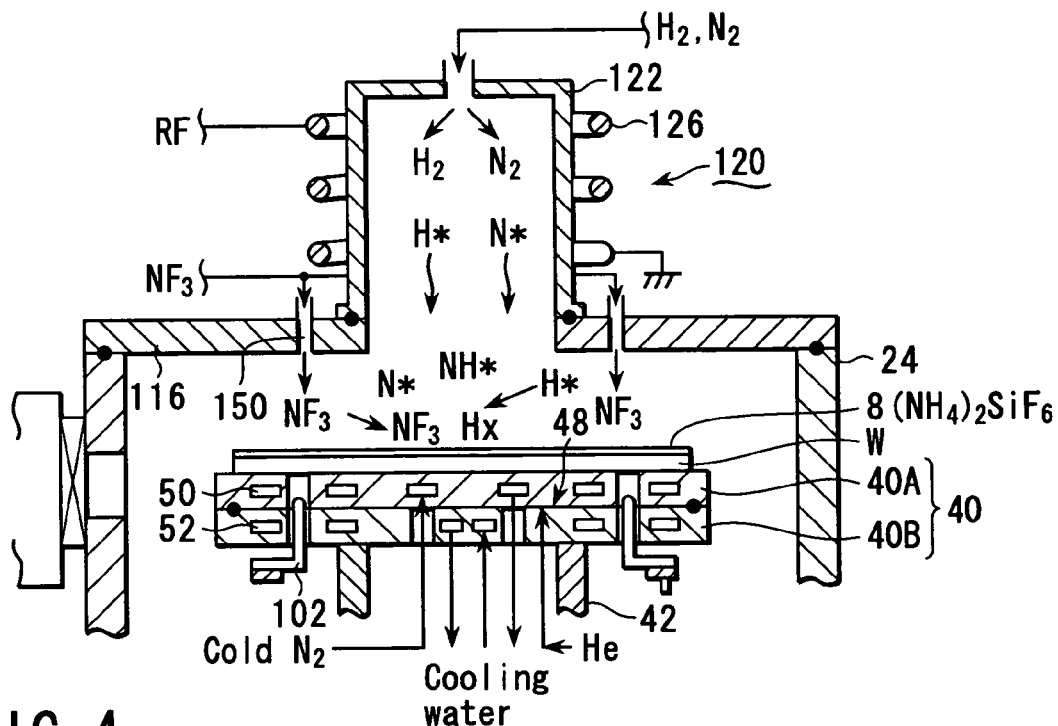
FIG. 4 is a view for explaining a low temperature process step of converting an oxide film on a semiconductor wafer W into an intermediate in the apparatus shown in FIG. 1.
Figure 5:
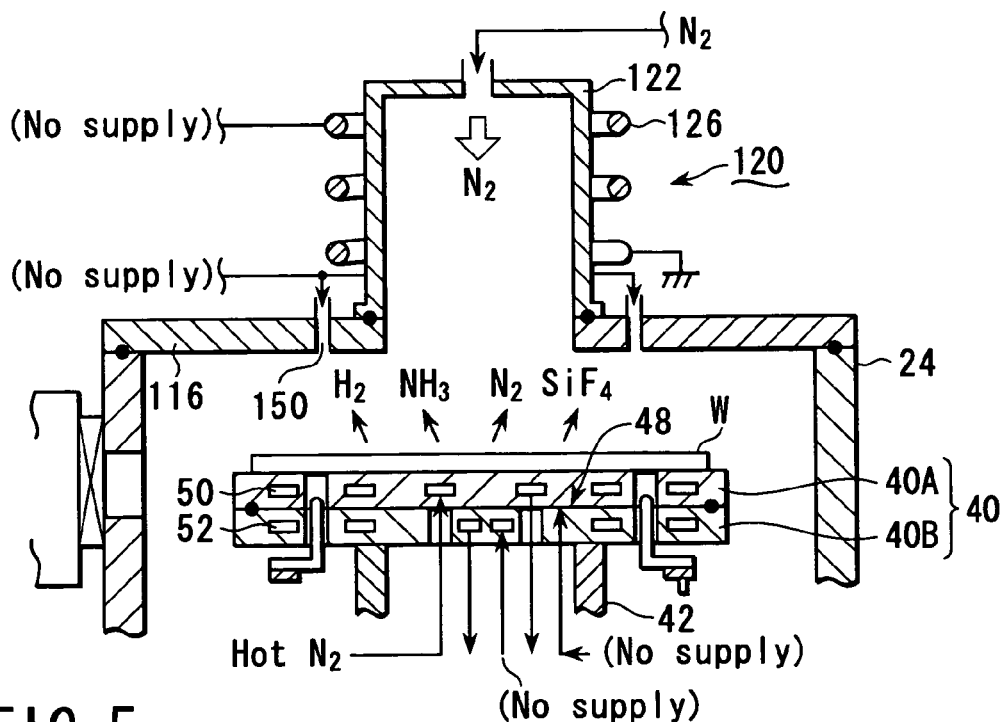
FIG. 5 is a view for explaining a high temperature process step of sublimating the intermediate in the apparatus shown in FIG. 1.
Figure 6:
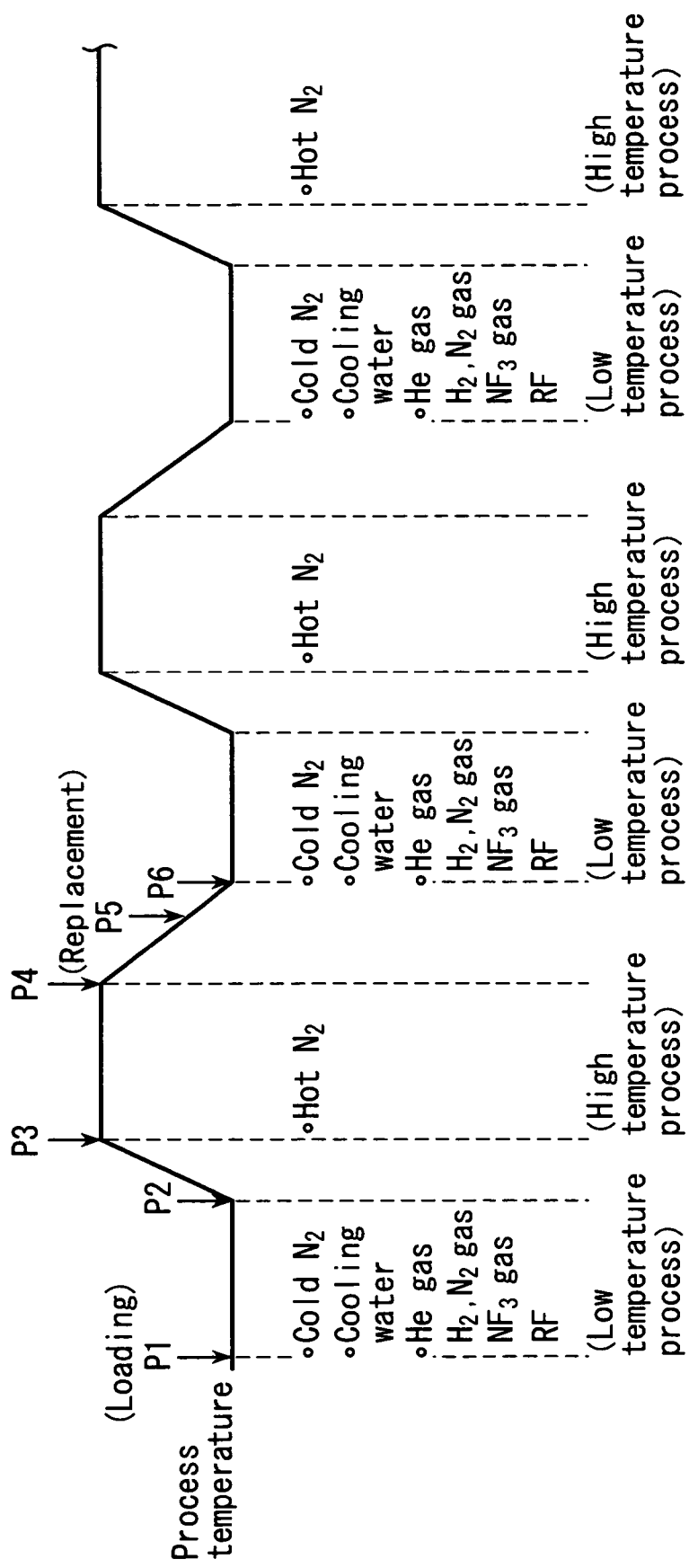
FIG. 6 is a flowchart showing the flow of a processing method according to an embodiment of the present invention.

Next, an explanation will be given with reference to FIGS. 1 to 6, of a single-substrate processing method performed in the processing apparatus 20, according to an embodiment of the present invention. FIG. 4 is a view for explaining a low temperature process step of converting the oxide film on the semiconductor wafer W into an intermediate in the apparatus 20. FIG. 5 is a view for explaining a high temperature process step of sublimating the intermediate in the apparatus 20. FIG. 6 is a flowchart showing the flow of a processing method according to an embodiment of the present invention.

First, a new semiconductor wafer W is transferred from the transfer chamber 36, through the port 34, into the process chamber 24, which has been kept in a vacuum state. The wafer W is placed on the worktable 40 (a point P1 in FIG. 6). At this time, a very thin but unnecessary natural oxide film has been formed on the silicon surface of the wafer W, due to various causes.

Prior to the wafer W being transferred in the process chamber 24, a cooling medium and a cooling water are supplied into the flow passage 50 in the upper block 40A and the auxiliary flow passage 52 in the lower block 40B, respectively, of the worktable 40, so that the worktable 40 has been kept at a predetermined temperature. In practice, the temperature of the worktable 40 is sufficiently lowered from the temperature of a high temperature process performed immediately before it, and is maintained at the predetermined temperature described above.

More specifically, in the thermal medium supply section 54, the switching valves 70 and 72 disposed on the supply line 58 are set to cause the thermal medium to flow through the cooler 66. Nitrogen gas is fed from the gas source 64 at a controlled flow rate, and is cooled to −5 to 40° C., and preferably 0 to 20° C. by the cooler 66. The cooling medium flows through the supply line 58 and reaches the flow passage 50 in the upper block 40. Then, the cooling medium flows entirely though the flow passage 50, and is exhausted through the exhaust line 62. As a consequence, the upper block 40A is cooled from a high temperature to a sufficiently low temperature. In addition, to accelerate temperature descent of the worktable 40, cooling water used as a cooling medium is fed and circulated through the auxiliary flow passage 52 in the lower block 40B, by the cooling liquid supply section 80, using the circulation line including the supply line 82 and exhaust line 84. The cooling water is set and kept at a temperature the same as that of the nitrogen gas cooled by the cooler 88, such as −5 to 40° C., and preferably 0 to 20° C. As a consequence, the lower block 40B is also cooled from a high temperature to a sufficiently low temperature, so that the predetermined temperature described above is held.

When the cooling liquid supply section 80 supplies the cooling water, the thermally conductive gas supply section 92 starts operating. He gas is supplied from the gas line 94 into the clearance 48 to increase the thermal conductivity between the upper block 40A and the lower block 40B. If the worktable 40 can be sufficiently rapidly cooled only by the cooling medium of cooled $N_2$ gas, the cooling water and He gas need not be used.

After the wafer W is placed on the worktable 40 kept at a predetermined temperature, the process chamber 24 is airtightly closed. Then, as shown in FIG. 4, $NF_3$ gas is fed at a controlled flow rate from the gas inlet ports 150 into the process chamber 24 while the process chamber 24 is vacuum-exhausted. At the same time, $N_2$ gas and $H_2$ gas are fed at controlled flow rates from the gas inlet port 132 of the exciting mechanism 120 into the plasma chamber 122. The $H_2$ gas and $N_2$ gas are turned into plasma by an RF power of 13.56 MHz applied to the coil antenna 126. In the plasma, H* and N* radicals are produced from the two gases, and NH* radicals other than those are produced by the combination of the radicals. The H*, N*, and NH* radicals fall down in the plasma chamber 122 and flow into the process chamber 24. The H*, N*, and NH* radicals react with $NF_3$ gas to produce $NF_3H_x$ in the process chamber 24. These excited species react with the oxide film ($SiO_2$) on the surface of the wafer W, and convert the oxide film into an intermediate film 8 made of $(NH_4)_2SiF_6$.

For example, the process conditions at this time are set as follows. The process pressure is about 532 Pa (4 Torr). As regards the flow rates of gases for a wafer W of 200-mm size, $N_2$ gas is at about 1000 sccm, $H_2$ gas at about 50 sccm, $NF_3$ gas at about 150 sccm. The process time is about 60 seconds. The process temperature (the temperature of the wafer W) is 0 to 40° C., and preferably 0 to 20° C. If the process temperature is out of this range, the oxide film cannot be sufficiently converted into the intermediate. It should be noted that these vales are only examples and do not limit the values of the parameters.

After the low temperature process step is performed for a predetermined time to produce the intermediate (a point P2 in FIG. 6), it is shifted to the high temperature process step to sublimate the intermediate. As shown in FIG. 5, the $NF_3$ gas and $H_2$ gas stop being supplied, and the RF power to the coil antenna 126 stop being applied, so that neither plasma nor radicals are generated. At the same time, the cooling liquid supply section 80 stops operating to prevent the cooling water from flowing in the auxiliary flow passage 52. Also, the He gas stops being supplied into the clearance 48 between the upper and lower blocks 40A and 40B. On the other hand, the $N_2$ gas from the $N_2$ gas source 136 is kept being supplied, while the process chamber 24 is kept being exhausted by the vacuum-exhaust section 32, thereby causing the $N_2$ gas to flow in the process chamber 24.

On the other hand, in the thermal medium supply section 54, the switching valves 70 and 72 one on either side of the cooler 66 are switched to cause $N_2$ gas to flow through the heater 68. The $N_2$ gas is heated by the heater 68 to a predetermined high temperature, such as about 100 to 400° C. The $N_2$ gas becomes a heating medium (hot $N_2$) and flows through the flow passage 50 in the upper block 40A to heat the worktable 40 to immediately increase its temperature.

After the temperature of the worktable 40 is increased and stabilized at a predetermined high temperature (a point P3 in FIG. 6), the high temperature process is performed in this state for a predetermined time, such as 30 seconds. As a consequence, the intermediate film 8 on the surface of the wafer is thermally decomposed and sublimes as $H_2$, $NH_3$, $N_2$, and $SiF_6$ gases and so forth. These gases are exhausted to the outside of the process chamber 24 along with the flow of the $N_2$ gas through the process chamber 24.

For example, the process conditions at this time are set as follows. The process pressure is about 93 Pa (0.7 Torr). The process temperature (the temperature of the wafer W) is 100 to 350° C., and preferably 150 to 250° C. If the process temperature is lower than this range, the intermediate film 8 cannot be sufficiently sublimated. If the process temperature is higher than this range, some electrical characteristics of the semiconductor devices may be deteriorated, and impurity metals may be exhausted from the sidewall or the like of the process chamber 24 and cause metal contamination of the wafer. It should be noted that these vales are only examples and do not limit the values of the parameters.

After the high temperature process step is completed (a point P4 in FIG. 6), the worktable 40 is rapidly cooled to conduct temperature descent in light of throughput, by an operation as explained between the points P1 and P2 in FIG. 6. Specifically, the thermal medium fed to the flow passage 50 in the upper block 40A is switched from the heating medium to the cooling medium. In addition, the cooling water used as a cooling medium is fed to the auxiliary flow passage 52 in the lower block 40B, while the He gas is supplied into the clearance 48 between the upper and lower blocks 40A and 40B. As a consequence, the temperature of the worktable 40 is rapidly lowered, as described above. Also at this time, if the worktable 40 can be sufficiently rapidly cooled only by the cooling medium of cooled $N_2$ gas, the cooling water and He gas need not be used.

After the temperature of the wafer W is lowered to a handling temperature, the processed wafer is replaced with a new wafer (a point P5 in FIG. 6). Then, the temperature of the worktable 40 is adjusted and stabilized at a predetermined low temperature (a point P6 in FIG. 6), and a low temperature process step is performed on the new wafer W, as described above. Thereafter, the low temperature process step and high temperature process step described above are repeatedly performed.

According to the pre-cleaning method described above, the low temperature process step and high temperature process step can be performed swiftly and continuously in one process chamber 24, without lowering throughput. A cooling medium (cooling water) is fed to the auxiliary flow passage 52 in the lower block 40B only for temperature descent, in light of the thermal characteristics of the worktable 40, such that temperature descent takes longer than temperature ascent in general. This makes it possible to accelerate the temperature descent speed of the worktable 40, so as to further improve throughput. At this time, a thermally conductive gas, such as He gas is supplied into the clearance 48 between the upper and lower blocks 40A and 40B. This facilitates thermal transfer between the blocks 40A and 40B.

Figure 7:
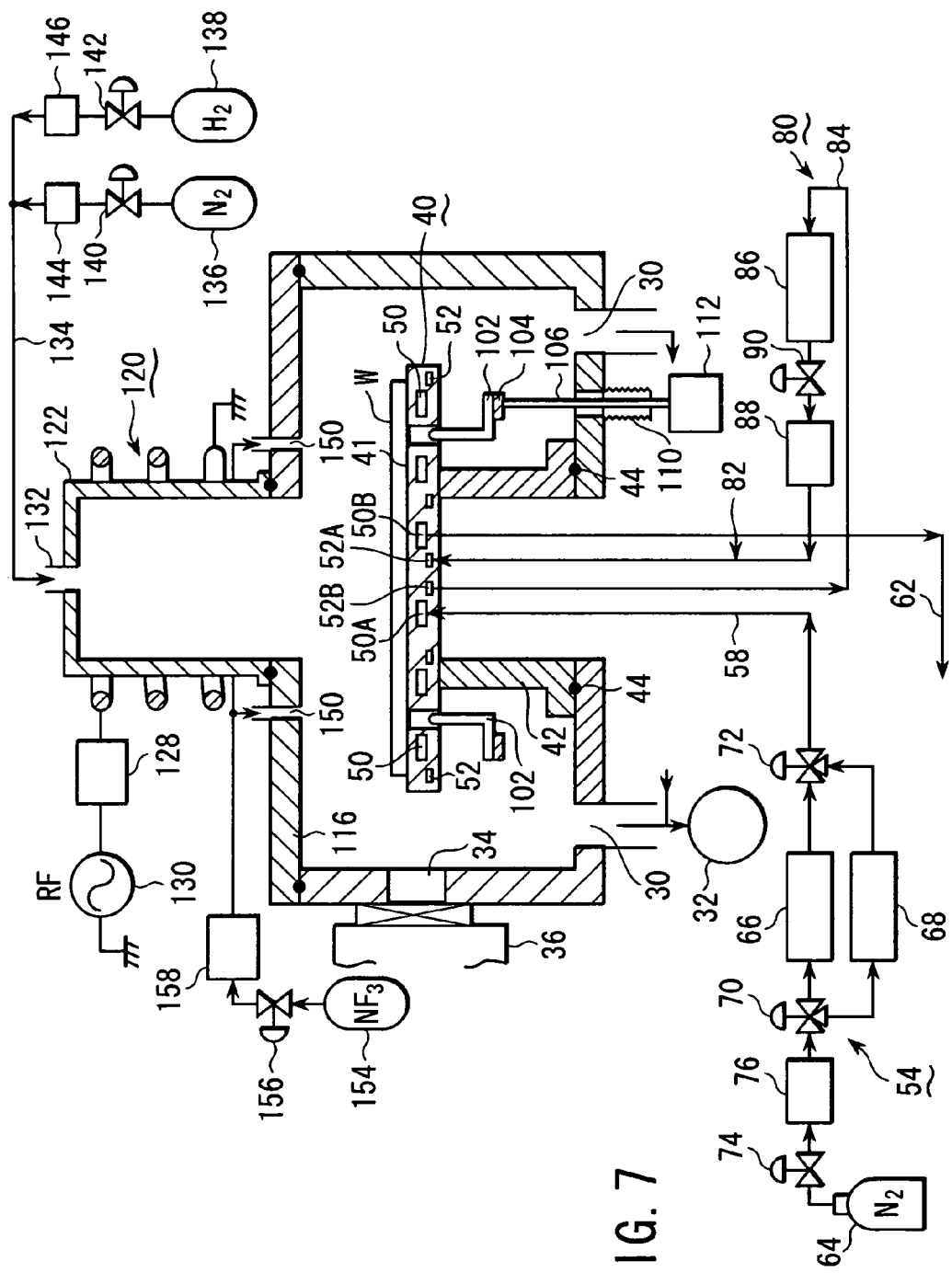
FIG. 7 is a constitutional view showing a single-substrate processing apparatus for a semiconductor process according to another embodiment of the present invention.

FIG. 7 is a constitutional view showing a single-substrate processing apparatus for a semiconductor process according to another embodiment of the present invention. This apparatus has a worktable 40 formed of one block shaped like a thin circular plate. The block is provided with a flow passage 50 and an auxiliary flow passage 52 separately formed therein. According to this apparatus, since the thermal capacity of the worktable 40 is small, temperature ascent and descent can be conducted rapidly.

Figure 8:
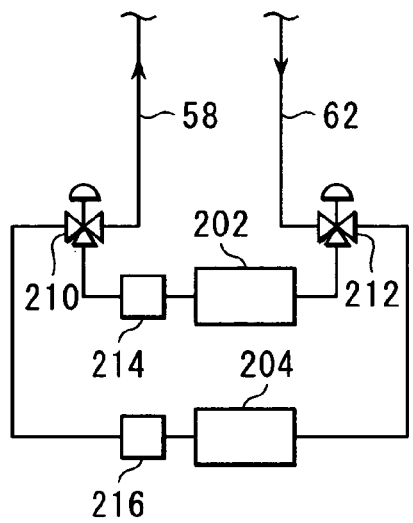
FIG. 8 is a view showing a thermal medium supply section according to still another embodiment of the present invention.

FIG. 8 is a view showing a thermal medium supply section according to still another embodiment of the present invention. This thermal medium supply section has a cooling medium source 202 and a heating medium source 204 connected in parallel with each other to both of a supply line 58 and an exhaust line 62, which are connected to a flow passage 50 in a worktable 40. The supply line 58 and exhaust line 62 are provided with switching valves 210 and 212, such as three-way valves, at the branching portions, so that the cooled or heated thermal medium is selectively supplied into the flow passage 50. The lines to the cooling medium source 202 and heating medium source 204 are respectively provided with flow controllers 214 and 216, such as mass flow controllers. Each of the cooling medium and heating medium can be either gas or liquid. Where a thermal medium consisting of liquid having a large thermal capacity is used, temperature ascent and descent of the worktable 40 can be rapidly conducted. Accordingly, where a liquid cooling medium is used, an auxiliary flow passage 52 for circulating cooling water or the like need not be formed in the worktable 40.

Figure 9:
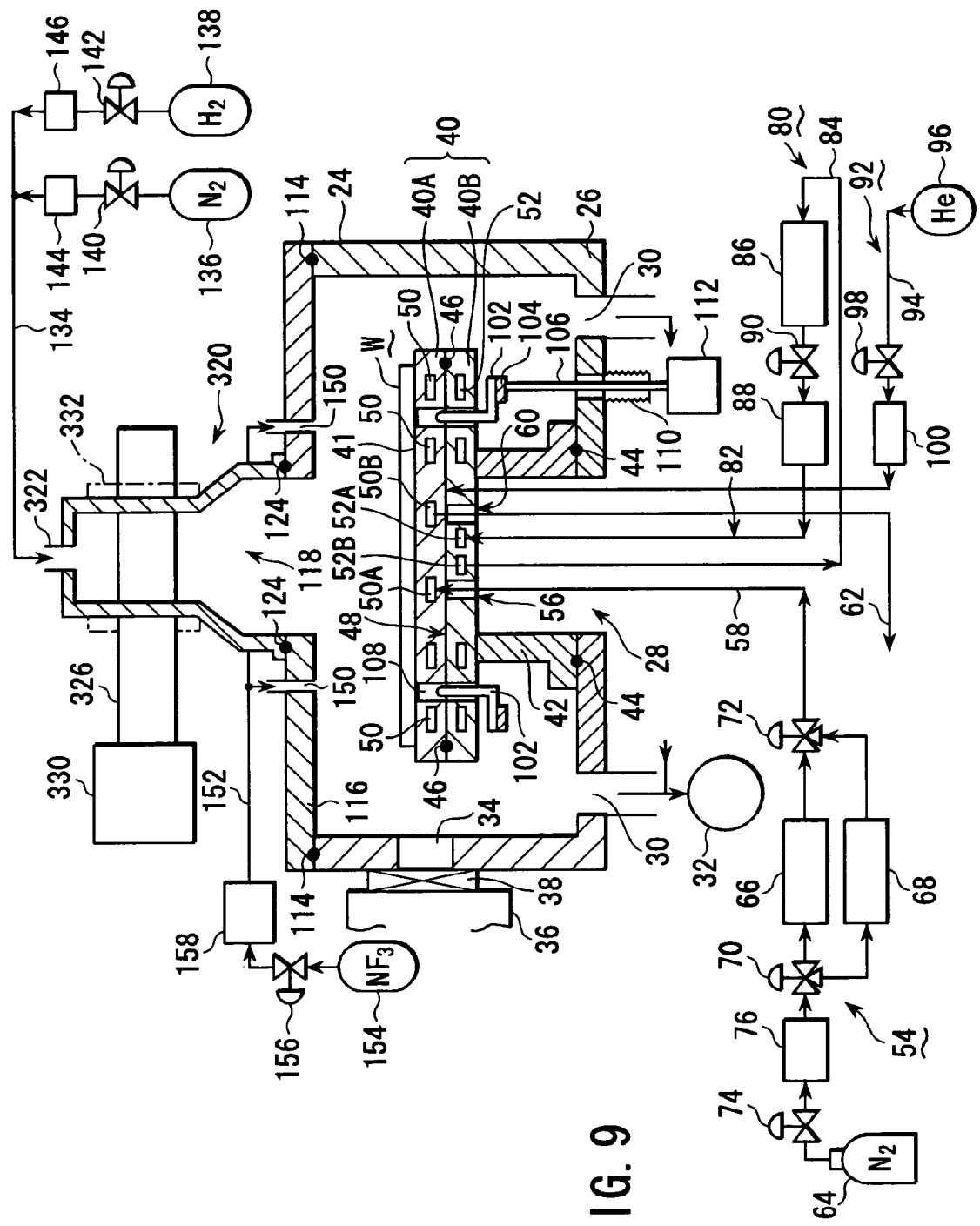
FIG. 9 is a constitutional view showing a single-substrate processing apparatus for a semiconductor process according to still another embodiment of the present invention.

FIG. 9 is a constitutional view showing a single-substrate processing apparatus for a semiconductor process according to still another embodiment of the present invention. The apparatus has an exciting mechanism 320 connected to a radicals port 118, which is arranged to turn part of a process gas into plasma not by RF power energy, but by microwave energy.

More specifically, the exciting mechanism 320 has a cylindrical remote plasma chamber 322, which is located such that plasma generated therein can essentially not reach a wafer W on a worktable 40. The plasma chamber 322 is made of an insulating material, such as quartz or ceramic. A microwave generator 330 for generating a microwave of 2.45 GHz is connected around the plasma chamber 322 through a wave guide tube (including a matching member) 326. The plasma chamber 322 is provided with a cooler 332 (not shown in detail) disposed therearound and using cooling water or the like. The generator 330 supplies the plasma chamber 322 with microwave energy, to excite and turn gas into plasma in the plasma chamber 322.

In the embodiments shown in FIGS. 1, 7, and 9, as a cooling medium or heating medium, another inactive gas, such as Ar, He, may be used, instead of nitrogen gas. Furthermore, not a gas but a liquid, such as water, may be used as the thermal medium. As a cooling medium fed into the auxiliary flow passage 52, another cooling medium, such as Garuden (™) or Florinert (™), may be used, instead of cooling water. As a process gas for forming an intermediate, $SF_6$ gas or $CF_4$ gas may be used instead of $NF_3$ gas. As a low temperature process step and a high temperature process step, a pre-cleaning method of removing an oxide film from the surface of a wafer is exemplified. The present invention may be applied to another processing method of continuously performing processes at two different process temperatures.

The present invention is not limited to the embodiments described above, but can be practiced in various manners without departing from the spirit and scope of the invention. The features of the embodiments described above can be arbitrarily combined with each other in practice, thereby obtaining combined effects.

The invention claimed is:

1. A single-substrate processing apparatus for a semiconductor process, comprising:
   a process chamber configured to accommodate a target substrate;
   an exhaust system configured to vacuum-exhaust the process chamber;
   a gas supply system configured to supply a process gas into the process chamber;
   a worktable disposed in the process chamber and having a thermally conductive mount surface configured to place the target substrate thereon, the worktable including a lower block and an upper block;
      a flow passage formed in the upper block of the worktable, in which a thermal medium flows for adjusting temperature of the target substrate through the mount surface;
      an auxiliary flow passage formed in the lower block of the worktable a first thermal medium supply system including a first cooler and a heater connected in parallel to a supply line connected to the flow passage and configured to selectively supply a first cooling medium and a heating medium into the flow passage;
      a second thermal medium supply system including a second cooler connected to the auxiliary flow passage and configured to supply a second cooling medium into the auxiliary flow passage when the first cooling medium is supplied into the flow passage;
   and a thermally conductive gas supply system configured to supply a thermally conductive gas between the upper block and the lower block, wherein the thermally conductive gas is supplied from the thermally conductive gas supply system to increase thermal conductivity between the upper block and the lower block when the first and second cooling mediums are supplied into the flow passage and the auxiliary flow passage, respectively, while supply of the thermally conductive gas from the thermally conductive gas supply system is configured to stop when the heating medium is supplied into the flow passage.

2. The apparatus according to claim 1, wherein the first cooler and the heater are connected in parallel with each other to the flow passage, and the first cooling medium and the heating medium are respectively formed by selectively supplying a common gas to the first cooler and the heater.

3. The apparatus according to claim 2, wherein the second cooler supplies a cooling liquid as the thermal medium into the auxiliary flow passage to accelerate cooling of the worktable.

4. The apparatus according to claim 1, further comprising an exciting mechanism configured to turn at least part of the process gas into plasma.

5. The apparatus according to claim 4, wherein the exciting mechanism comprises a remote plasma chamber disposed on the process chamber at a position where plasma generated therein does essentially not reach the target substrate on the worktable, and a member configured to supply energy for exciting and turning gas into plasma in the remote plasma chamber.

6. The apparatus according to claim 1, wherein the flow passage and the auxiliary flow passage are flow passages formed to circulate in the worktable.

7. The apparatus according to claim 1, wherein the worktable is provided with through holes formed therein, in which lifter pins move up and down.

8. The apparatus according to claim 1, wherein the second cooling medium is supplied into the auxiliary flow passage when cooling the target substrate.

9. The apparatus according to claim 1, wherein the flow passage is connected to a supply line and an exhaust line respectively via first and second through holes formed in the lower block, such that the thermal medium is supplied from the supply line, flows through the flow passage, and is exhausted into the exhaust line.

10. A single-substrate processing method for use in a single-substrate processing apparatus for a semiconductor process including a process chamber configured to accommodate a target substrate; an exhaust system configured to vacuum-exhaust the process chamber; a gas supply system configured to supply a process gas into the process chamber; a worktable disposed in the process chamber and having a thermally conductive mount surface configured to place the target substrate thereon, the worktable including a lower block and an upper block; a flow passage formed in the upper block of the worktable, in which a thermal medium flows for adjusting temperature of the target substrate through the mount surface; an auxiliary flow passage formed in the lower block of the worktable; a first thermal medium supply system including a first cooler and a heater connected in parallel to a supply line connected to the flow passage and configured to selectively supply a first cooling medium and a heating medium into the flow passage; a second thermal medium supply system including a second cooler connected to the auxiliary flow passage and configured to supply a second cooling medium into the auxiliary flow passage when the first cooling medium is supplied into the flow passage; and a thermally conductive gas supply system configured to supply a thermally conductive gas between the upper block and the lower block, wherein the thermally conductive gas is supplied from the thermally conductive gas supply system to increase thermal conductivity between the upper block and the lower block when the first and second cooling mediums are supplied into the flow passage and the auxiliary flow passage, respectively, while supply of the thermally conductive gas from the thermally conductive gas supply system is configured to stop when the heating medium is supplied into the flow passage the method, comprising:

setting the process chamber in vacuum;

performing a first process while supplying the first cooling medium into the flow passage to set the target substrate at a first process temperature;

performing a second process while supplying the heating medium into the flow passage to set the target substrate at a second process temperature higher than the first process temperature wherein the first and second cooling mediums and the thermally conductive gas are not supplied; and cooling down the target substrate while supplying the first and second cooling mediums into the flow passage and the auxiliary flow passage, respectively, and supplying the thermally conductive gas to increase thermal conductivity between the upper block and the lower block.

11. The method according to claim 10, wherein the first process is a process of converting a semiconductor oxide film on the target substrate into an intermediate film, and, in the first process, the process chamber is supplied with a first process gas, which reacts with the semiconductor oxide film to convert the semiconductor oxide film into the intermediate film; and the second process is a process of evaporating the intermediate film by thermal decomposition, and, in the second process, the process chamber is supplied with a second process gas, which assists removal of evaporated matters of the intermediate film.

12. The method according to claim 11, wherein the first cooling medium is set at a temperature of −5 to 40° C., and the heating medium is set at a temperature of 100 to 400° C.

13. A single-substrate processing apparatus for performing a first process of converting a semiconductor oxide film on a target substrate into an intermediate film, and a second process of evaporating the intermediate film by thermal decomposition, to remove the semiconductor oxide film, the apparatus comprising:

a process chamber configured to accommodate a target substrate;

an exhaust system configured to vacuum-exhaust the process chamber;

a gas supply system configured to supply the process chamber selectively with a first process gas, which reacts with the semiconductor oxide film to convert the semiconductor oxide film into the intermediate film in the first process, and a second process gas, which assists removal of evaporated matters of the intermediate film in the second process;

a worktable disposed in the process chamber and having a thermally conductive mount surface configured to place the target substrate thereon, the worktable including a lower block and an upper block; a flow passage formed in the upper block of the worktable, in which a thermal medium flows for adjusting temperature of the target substrate through the mount surface;

an auxiliary flow passage formed in the lower block of the worktable, a first thermal medium supply system including a first cooler and a heater connected in parallel to a supply line connected to the flow passage and configured to selectively supply a first cooling medium and a heating medium into the flow passage, wherein the first cooling medium is supplied into the flow passage in the first process, and the heating medium is supplied into the flow passage in the second process; and a second thermal medium supply system including a second cooler connected to the auxiliary flow passage and configured to supply a second cooling medium into the auxiliary flow passage and a thermally conductive gas supply system configured to supply a thermally conductive gas between the upper block and the lower block, wherein the thermally conductive gas is supplied from the thermally conductive as supply system to increase thermal conductivity between the upper block and the lower block when the first and second cooling mediums are supplied into the flow passage and the auxiliary flow passage, respectively, while supply of the thermally conductive gas from the thermally conductive gas supply system is configured to stop when the heating medium is supplied into the flow passage.

14. The apparatus according to claim 13, wherein the first cooling medium is set at a temperature of −5 to 40° C., and the heating medium is set at a temperature of 100 to 400° C.

15. The apparatus according to claim 14, wherein the second cooler supplies a cooling liquid as the thermal medium into the auxiliary flow passage to accelerate cooling of the worktable after the second process.

16. The apparatus according to claim 13, wherein the first a cooler and the heater are connected in parallel with each other to the flow passage, and the first cooling medium and the heating medium are respectively formed by selectively supplying a common gas to the first cooler and the heater.

17. The apparatus according to claim 13, wherein the first process gas contains radicals.

18. The apparatus according to claim 17, further comprising an exciting mechanism configured to turn at least part of the first process gas into plasma, so as to generate the radicals.

19. The apparatus according to claim 18, wherein the exciting mechanism comprises a remote plasma chamber disposed on the process chamber at a position where plasma generated therein does essentially not reach the target substrate on the worktable, and a member configured to supply energy for exciting and turning gas into plasma in the remote plasma chamber.

20. The apparatus according to claim 18, wherein the first process gas contains a gas selected from the group consisting of $NE_3$ gas, $SF_6$ gas, and $CF_4$ gas, and contains $N_2$ gas and $H_2$ gas, and wherein the exciting mechanism turns the $N_2$ gas and $H_2$ gas into plasma.

21. The apparatus according to claim 13, wherein the second cooling medium is supplied into the auxiliary flow passage when cooling the target substrate.

22. The apparatus according to claim 13, wherein the flow passage is connected to a supply line and an exhaust line respectively via first and second through holes formed in the lower block, such that the thermal medium is supplied from the supply line, flows through the flow passage, and is exhausted into the exhaust line.

* * * * *